(12) United States Patent
Iwashita

(10) Patent No.: US 9,180,668 B2
(45) Date of Patent: Nov. 10, 2015

(54) PIEZOELECTRIC ACTUATOR, INK JET HEAD, AND METHOD FOR PRODUCING PIEZOELECTRIC ACTUATOR

(71) Applicant: KYOCERA Corporation, Kyoto-shi, Kyoto (JP)

(72) Inventor: Shuzo Iwashita, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/389,101

(22) PCT Filed: Mar. 29, 2013

(86) PCT No.: PCT/JP2013/059612
§ 371 (c)(1),
(2) Date: Sep. 29, 2014

(87) PCT Pub. No.: WO2013/147196
PCT Pub. Date: Oct. 3, 2013

(65) Prior Publication Data
US 2015/0070443 A1    Mar. 12, 2015

(30) Foreign Application Priority Data

Mar. 30, 2012   (JP) .................................. 2012-079470

(51) Int. Cl.
*B41J 2/045* (2006.01)
*B41J 2/14* (2006.01)
(Continued)

(52) U.S. Cl.
CPC .......... *B41J 2/14201* (2013.01); *B41J 2/14233* (2013.01); *C04B 35/493* (2013.01); *H01L 41/0973* (2013.01); *H01L 41/18* (2013.01); *H01L 41/1871* (2013.01); *H01L 41/1875* (2013.01); *H01L 41/1876* (2013.01);
(Continued)

(58) Field of Classification Search
None
See application file for complete search history.

(56) References Cited

U.S. PATENT DOCUMENTS

2003/0156156 A1*  8/2003  Sakaida et al. ................. 347/47
2005/0212865 A1*  9/2005  Mita .............................. 347/70
(Continued)

FOREIGN PATENT DOCUMENTS

| JP | 6-196770 A | 7/1994 |
|---|---|---|
| JP | 2004-128492 A | 4/2004 |

(Continued)

OTHER PUBLICATIONS

International Search Report, PCT/JP2013/059612, Apr. 26, 2013, 2 pgs.

*Primary Examiner* — Erica Lin
(74) *Attorney, Agent, or Firm* — Volpe and Koenig, P.C.

(57) ABSTRACT

A head has a base and a piezoelectric element which is superimposed on and fastened to the base in a thickness direction. The piezoelectric element has a plate-shaped piezoelectric body, and a common electrode and a individual electrode arranged so as to sandwich the piezoelectric body in the thickness direction. The base has a higher thermal expansion coefficient than the piezoelectric body (the piezoelectric element 23). The piezoelectric body has a tetragonal principal crystal phase, in which the degree of orientation of the c-axis toward one side in the thickness direction (positive side in z direction) in the region sandwiched by the common electrode and the individual electrode is 44% or more and 56% or less in terms of the Lotgering factor and in which the residual stress in the surface direction is 0 MPa or more and 35 MPa or less in the direction of compression.

8 Claims, 16 Drawing Sheets

(51) Int. Cl.
*H01L 41/09* (2006.01)
*H01L 41/187* (2006.01)
*H01L 41/253* (2013.01)
*H01L 41/313* (2013.01)
*C04B 35/493* (2006.01)
*H01L 41/18* (2006.01)
*H01L 41/25* (2013.01)

(52) U.S. Cl.
CPC .............. *H01L41/25* (2013.01); *H01L 41/253* (2013.01); *H01L 41/313* (2013.01); *B41J 2002/14491* (2013.01); *C04B 2235/32* (2013.01); *C04B 2235/3213* (2013.01); *C04B 2235/3215* (2013.01); *C04B 2235/3279* (2013.01); *C04B 2235/3284* (2013.01); *C04B 2235/3294* (2013.01); *C04B 2235/96* (2013.01)

(56) References Cited

U.S. PATENT DOCUMENTS

2008/0218028 A1* 9/2008 Dollgast et al. ................ 310/328
2010/0225710 A1* 9/2010 Iwashita et al. ................. 347/71

FOREIGN PATENT DOCUMENTS

| JP | 2004-158849 A | 6/2004 |
| JP | 2006-174618 A | 6/2006 |
| JP | 2006-324518 A | 11/2006 |
| JP | 2007-273853 A | 10/2007 |
| JP | 2010-228145 A | 10/2010 |

\* cited by examiner

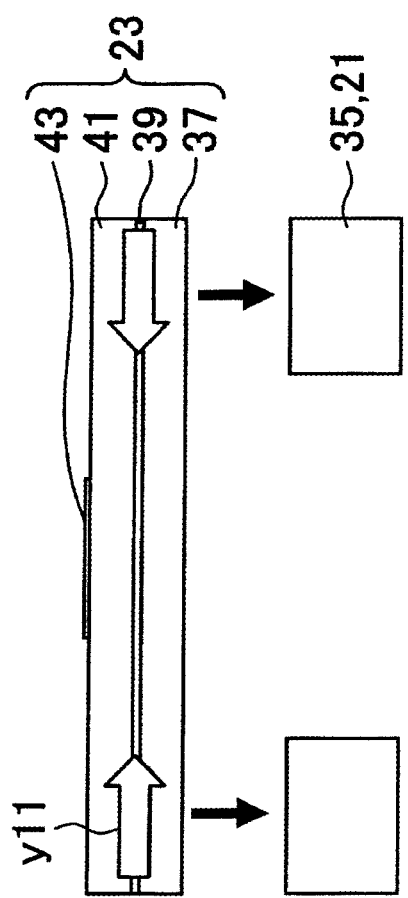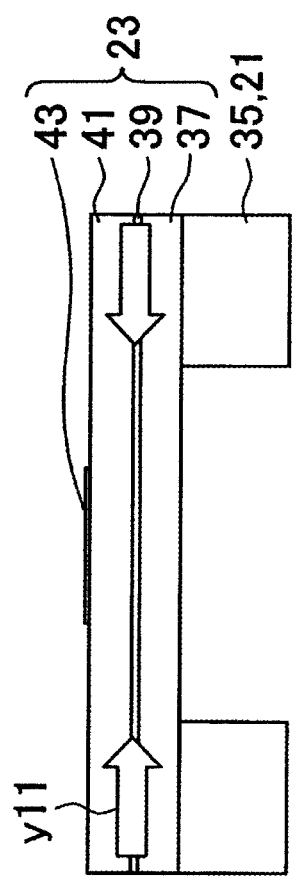
FIG.4A
FIG.4B

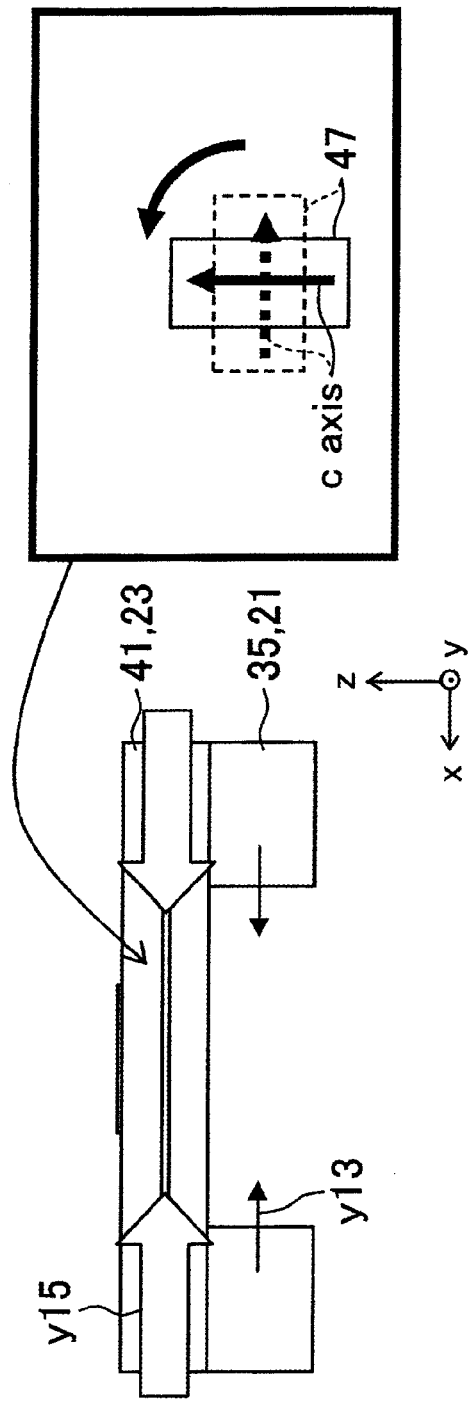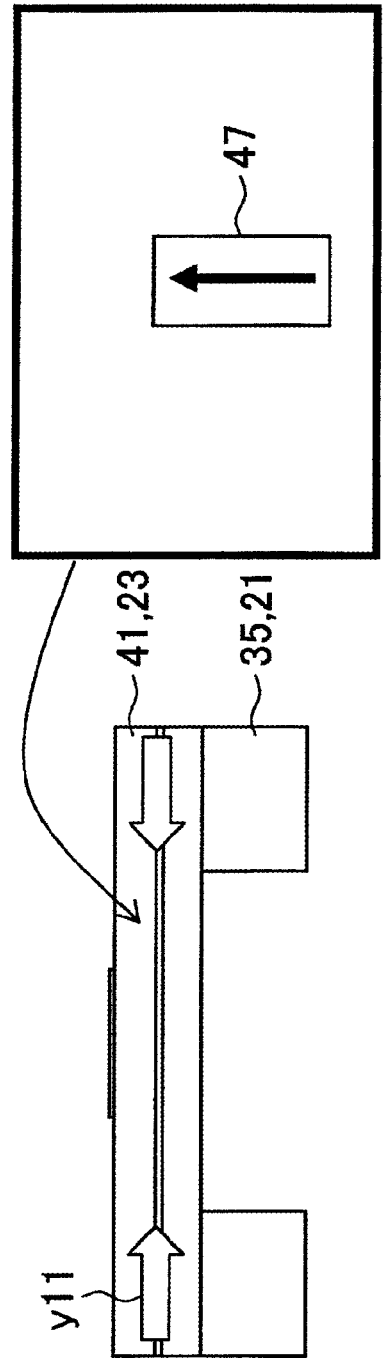

FIG.7

| No. | EXAMPLE | COMPARATIVE EXAMPLE | Zr/Ti | T1 (°C) | T2 (°C) | ΔT (°C) | σ (MPa) | (002)/[(200)+(002)] | LF (%) | D (nm) | V (%) |
|---|---|---|---|---|---|---|---|---|---|---|---|
| 1 | – | – | – | – | – | – | 0 | 0.252 | 0 | – | – |
| 2 | | ○ | 0.5/0.5 | 25 | 25 | 0 | −23.0 | 0.477 | 28.9 | 75.0 | 4.1 |
| 3 | | ○ | 0.5/0.5 | 69 | 25 | 44 | −42.0 | 0.510 | 34.5 | 72.2 | 2.4 |
| 4 | | ○ | 0.5/0.5 | 69 | 25 | 44 | −48.0 | 0.541 | 38.6 | 72.2 | 2.2 |
| 5 | | ○ | 0.5/0.5 | 89 | 25 | 64 | −49.0 | 0.547 | 39.4 | 68.8 | 2.0 |
| 6 | | ○ | 0.5/0.5 | 89 | 25 | 64 | −53.0 | 0.569 | 42.4 | 68.8 | 1.9 |
| 7 | | ○ | 0.5/0.5 | 98 | 25 | 73 | −63.0 | 0.579 | 43.7 | 67.2 | 1.5 |
| 8 | | ○ | 0.5/0.5 | 106 | 25 | 81 | −53.0 | 0.582 | 44.1 | 65.9 | 1.9 |
| 9 | | ○ | 0.5/0.5 | 106 | 25 | 81 | −57.9 | 0.606 | 47.3 | 65.9 | 1.7 |
| 10 | | ○ | 0.5/0.5 | 120 | 25 | 95 | −66.0 | 0.626 | 50.0 | 62.7 | 0.9 |
| 11 | ○ | | 0.5/0.5 | 25 | −70 | 95 | −20.0 | 0.626 | 49.9 | 79.9 | 1.0 |
| 12 | ○ | | 0.5/0.5 | 25 | −70 | 95 | −20.3 | 0.625 | 49.9 | 79.8 | 1.0 |
| 13 | ○ | | 0.5/0.5 | 25 | −70 | 95 | −20.1 | 0.626 | 50.0 | 79.9 | 1.0 |
| 14 | ○ | | 0.5/0.5 | 25 | −70 | 95 | −20.3 | 0.626 | 50.0 | 79.8 | 0.9 |
| 15 | ○ | | 0.5/0.5 | 25 | −70 | 95 | −20.2 | 0.626 | 50.0 | 79.8 | 0.9 |
| 16 | ○ | | 0.5/0.5 | 25 | −70 | 95 | −20.1 | 0.625 | 49.9 | 79.9 | 1.0 |
| 17 | ○ | | 0.5/0.5 | 25 | 10 | 15 | −20.1 | 0.501 | 33.3 | 79.9 | 3.0 |
| 18 | △ | | 0.5/0.5 | 25 | 0 | 25 | −20.3 | 0.517 | 35.4 | 79.8 | 2.8 |
| 19 | △ | | 0.5/0.5 | 25 | −10 | 35 | −20.2 | 0.533 | 37.6 | 79.8 | 2.5 |
| 20 | △ | | 0.5/0.5 | 25 | −20 | 45 | −20.2 | 0.549 | 40.0 | 79.8 | 2.2 |
| 21 | ○ | | 0.5/0.5 | 25 | −40 | 65 | −20.1 | 0.581 | 44.0 | 79.9 | 1.7 |
| 22 | ○ | | 0.5/0.5 | 25 | −60 | 85 | −20.0 | 0.613 | 48.3 | 79.9 | 1.2 |
| 23 | | ○ | 0.5/0.5 | 50 | 25 | 25 | −34.3 | 0.517 | 35.4 | 74.9 | 2.8 |
| 24 | | | 0.5/0.5 | 100 | 25 | 75 | −56.9 | 0.597 | 46.1 | 66.9 | 1.4 |
| 25 | | ○ | 0.5/0.5 | 110 | 25 | 85 | −61.5 | 0.613 | 48.3 | 65.3 | 1.2 |
| 26 | ○ | | 0.5/0.5 | 50 | −70 | 120 | −34.3 | 0.669 | 56.0 | 74.9 | 0.2 |
| 27 | △ | | 0.5/0.5 | 100 | −70 | 170 | −56.9 | 0.667 | 55.5 | 66.9 | 0.2 |
| 28 | △ | | 0.5/0.5 | 110 | −70 | 180 | −61.5 | 0.670 | 55.9 | 65.3 | 0.2 |
| 29 | | ○ | 0.5/0.5 | 120 | 25 | 95 | −66.5 | 0.627 | 50.3 | 62.8 | 1.0 |
| 30 | | ○ | 0.5/0.5 | 120 | 25 | 95 | −49.5 | 0.626 | 50.0 | 63.1 | 1.8 |
| 31 | | ○ | 0.5/0.5 | 120 | 25 | 95 | −66.0 | 0.626 | 50.0 | 64.2 | 5.2 |
| 32 | | ○ | 0.495/0.505 | 25 | 25 | 0 | −22.8 | 0.475 | 28.8 | 70.1 | 4.0 |
| 33 | | ○ | 0.495/0.505 | 120 | 25 | 95 | −65.8 | 0.624 | 50.6 | 61.5 | 0.8 |
| 34 | ○ | | 0.495/0.505 | 25 | −70 | 95 | −20.0 | 0.625 | 50.2 | 75.2 | 0.8 |
| 35 | | ○ | 0.495/0.505 | 110 | 25 | 85 | −61.2 | 0.611 | 49.0 | 63.2 | 1.0 |
| 36 | △ | | 0.495/0.505 | 110 | −70 | 180 | −61.2 | 0.669 | 56.0 | 63.8 | 0.1 |

FIG.14

| No. | EXAMPLE | COMPARATIVE EXAMPLE | Zr/Ti | T1 (°C) | T2 (°C) | ΔT (°C) | σ (MPa) WORKING TEMPERATURE | (002)/ [(200)+(002)] ORDINARY TEMPERATURE | LF (%) ORDINARY TEMPERATURE | D (nm) WORKING TEMPERATURE | V (%) WORKING TEMPERATURE |
|---|---|---|---|---|---|---|---|---|---|---|---|
| 37 | | ○ | 0.5/0.5 | 45 | 25 | 20 | −20.8 | 0.510 | 34.9 | 78.8 | 2.6 |
| 38 | ○ | | 0.5/0.5 | 45 | −70 | 115 | −21.0 | 0.670 | 55.9 | 78.3 | 0.1 |
| 39 | | ○ | 0.5/0.5 | 25 | 25 | 0 | −11.0 | 0.476 | 28.7 | 81.0 | 4.5 |
| 40 | ○ | | 0.5/0.5 | 25 | −70 | 95 | −10.9 | 0.625 | 50.0 | 81.5 | 1.1 |

PIEZOELECTRIC ACTUATOR, INK JET HEAD, AND METHOD FOR PRODUCING PIEZOELECTRIC ACTUATOR

TECHNICAL FIELD

The present invention relates to a piezoelectric actuator, an ink jet head, and a method for producing a piezoelectric actuator.

BACKGROUND ART

There are known a piezoelectric actuator which utilizes deformation of a piezoelectric element and a piezo type ink jet head which applies pressure to ink by a piezoelectric actuator to discharge ink drops (for example P Patent Literature 1 and 2).

For example, the piezoelectric actuator of an ink jet head in Patent Literature 1 has a base in which a plurality of concave pressurizing chambers in which ink is filled are formed and a piezoelectric element which is superimposed on and fastened to the base so as to close the pressurizing chambers. The piezoelectric element in Patent Literature 1 is a so-called unimorph type and has, from the base side, a diaphragm, common electrode, piezoelectric body, and individual electrodes in that order. The piezoelectric body is polarized in a thickness direction (lamination direction). When voltage is applied to the piezoelectric body by the common electrode and individual electrodes, the piezoelectric body contracts in the surface direction and that contraction is limited by the diaphragm. As a result, the piezoelectric element is bent to the pressurizing chamber side (center side displaces to the pressurizing chamber side), so pressure is given to the ink in the pressurizing chamber.

CITATIONS LIST

Patent Literature

Patent Literature 1: Japanese Patent Publication No. 2006-174618A
Patent Literature 2: Japanese Patent Publication No. 2010-228145A

SUMMARY OF INVENTION

Technical Problem

The piezoelectric element and the base are for example bonded by using a thermosetting resin in a high temperature state. On the other hand, the base is for example comprised of a metal from the viewpoints of strength and workability, therefore is higher in thermal expansion coefficient compared with the piezoelectric body. Accordingly, when the piezoelectric actuator is brought to an ordinary temperature after bonding, the base contracts more than the piezoelectric body, therefore a residual stress in the surface direction is generated in the piezoelectric body. As a result, the piezoelectric body exhibits a state where it is contracted in the surface direction even in a state where a voltage is not applied, therefore the displacement of the piezoelectric element when a voltage is applied is lowered.

Therefore, bonding the piezoelectric elements and the base material at an ordinary temperature may be considered. In this case, however, variations of displacement arise among the plurality of pressurizing chambers or among the plurality of piezoelectric actuators (plurality of ink jet heads).

Accordingly, desirably a piezoelectric actuator, an ink jet head, and a method for producing the piezoelectric actuator which are capable of suppressing variations in displacement are provided.

Solution to Problem

A piezoelectric actuator according to one aspect of the present invention has a base; and a piezoelectric element which has a plate-shaped piezoelectric body and a pair of electrodes arranged so as to sandwich the piezoelectric body in a thickness direction and is superimposed on and fastened to the base in the thickness direction. The base has a higher thermal expansion coefficient than the piezoelectric element. and the piezoelectric body has a tetragonal principal crystal phase, in which the degree of orientation of the c-axis toward one side in the thickness direction in the region sandwiched by the pair of electrodes is 44% or more and 56% or less in terms of the Lotgering factor and in which the residual stress in the surface direction is 0 MPa or more and 35 MPa or less in the direction of compression.

An ink jet head according to one aspect of the present invention has a base provided with a concave pressurizing chamber for holding ink; and a piezoelectric element which has a plate-shaped piezoelectric body and a pair of electrodes arranged so as to sandwich the piezoelectric body in a thickness direction and is superimposed on and fastened to the base in the thickness direction so as to close the pressurizing chamber. The base has a higher thermal expansion coefficient than the piezoelectric element. The piezoelectric body has a tetragonal principal crystal phase, in which the degree of orientation of the c-axis toward one side in the thickness direction in the region sandwiched by the pair of electrodes is 44% or more and 56% or less in terms of the Lotgering factor, and the residual stress in the surface direction is 0 MPa or more and 35 MPa or less in the direction of compression.

A method for producing a piezoelectric actuator according to one aspect of the present invention includes a step of preparing a piezoelectric element which has a plate-shaped piezoelectric body and a pair of electrodes arranged so as to sandwich the piezoelectric body in the thickness direction; a step of preparing a base having a higher thermal expansion coefficient than the piezoelectric element; a step of superimposing the piezoelectric element and the base on each other in the thickness direction and fastening them; and a step of, after the step of fastening, cooling the piezoelectric element and the base down to a temperature lower than ordinary temperature.

Advantageous Effects of Invention

According to the above configurations or procedures, variations in displacement can be suppressed.

BRIEF DESCRIPTION OF DRAWINGS

FIG. 4A to FIG. 4E are cross-sectional views for explaining an example of a method of production of a head.

FIG. 7 A table which shows conditions and modes of operation etc. of examples and comparative examples.

FIG. 14 A table which shows the conditions and modes of operation etc. of examples and comparative examples in addition to FIG. 7.

DESCRIPTION OF EMBODIMENTS

Figure 1:
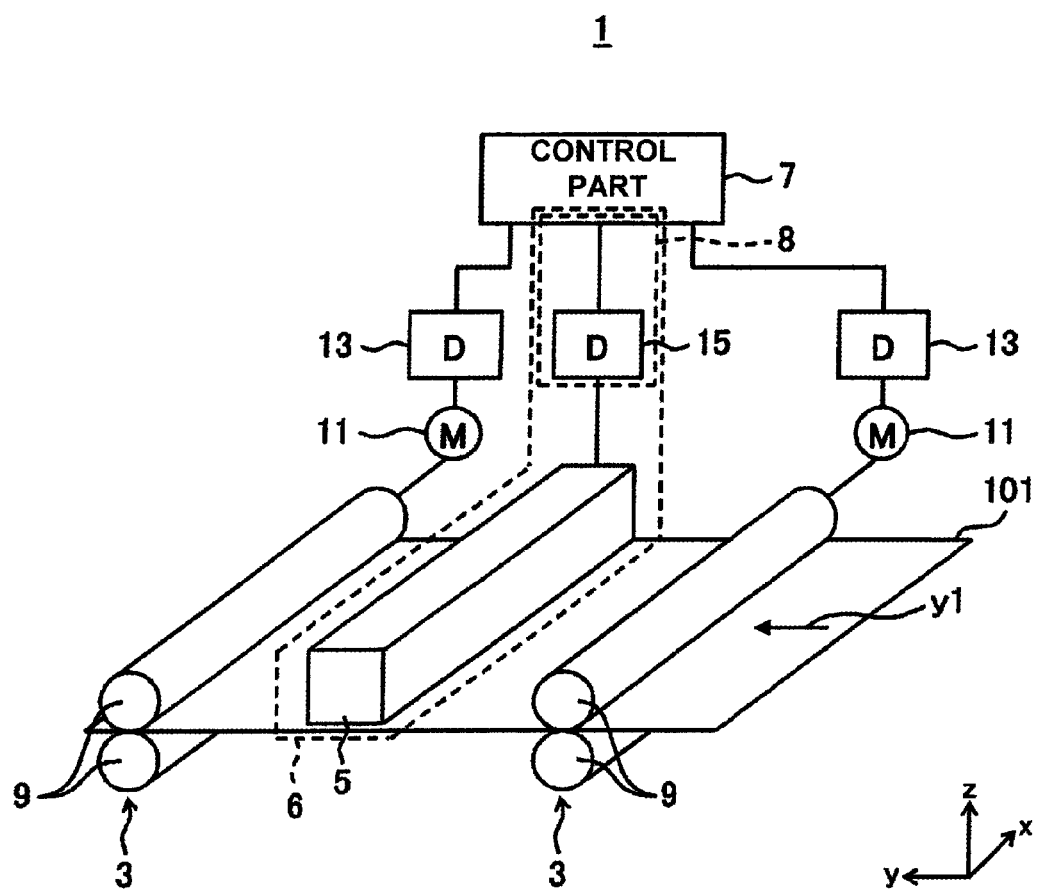
FIG. 1 A perspective view which schematically shows principal parts of a recording apparatus according to an embodiment of the present invention.

FIG. 1 is a perspective view which schematically shows principal parts of a recording apparatus 1 according to an embodiment of the present invention.

Note that, in the recording apparatus 1 and an ink jet head 5 which will be explained later, any direction may be made upward or downward. However, in the following description, for convenience, an orthogonal coordinate system xyz is defined, and use is sometimes made of an "upper surface", "lower surface", and other terms where the positive side of the z-direction (upper part in the drawing sheet in FIG. 1) is the upper part.

The recording apparatus 1 has for example conveyance parts 3 which carry a media (for example paper) 101 to a direction indicated by an arrow y1, a head 5 which discharges ink drops toward the media 101 which is being conveyed, and a control part 7 which controls operations of the conveyance parts 3 and the head 5.

The conveyance parts 3 for example convey a plurality of media 101 stacked in a not shown supply stack one by one to a not shown discharge stack. The conveyance parts 3 may be given a known suitable configuration. FIG. 1 exemplifies conveyance parts which have a conveyance route made a straight path and are provided with rollers 9 abutting against the media 101 and motors 11 for rotating the rollers 9.

The head 5 is arranged in the middle of the conveyance route of the media 101 and faces the media 101 from the positive side of the z-direction. The head 5 may be a serial head which performs a shuttle movement in the direction (main scanning direction, x-direction) perpendicular to the printing surface and conveyance direction of the media 101 or may be a line head which is (substantially) fastened in the perpendicular direction. Note that, in the present embodiment, an explanation will be given by taking as an example a case where the head 5 is a line head.

The head 5 ejects and deposits ink drops upon the media 101 at a plurality of positions in the x-direction. By repeatedly performing the operation along with the conveyance of the media 101, a two-dimensional image is formed on the media 101.

The control part 7 is configured by including for example a CPU, ROM, RAM, and external memory unit. The control part 7 outputs control signals to motor-use drivers 13 to thereby apply desired voltages to the motors 11 to control the motors 11. In the same way, the control part 7 outputs control signals to a head-use driver 15 to thereby apply a desired voltage to the head 5 to control the head 5.

The head-use driver 15, or the head-use driver 15 and a portion of control part 7 configures a drive signal output part 8 which generates a drive signal (voltage to be applied to the head 5) containing a drive pulse (drive waveform) having a predetermined drive frequency and outputs the same to the head 5. The drive signal output part 8 is configured by for example a driver IC or circuit board.

Note that, in FIG. 1, the drive signal output part 8 and the head 5 are shown as parts which are different from each other. However, a portion or all of the drive signal output part 8 may be mounted on the head 5 as well. In this case, it is also possible to grasp the head 5 and the section (a portion or all) of the drive signal output part 8 which is mounted on the head 5 as configuring a head 6 in a broad sense as a whole.

Figure 2:
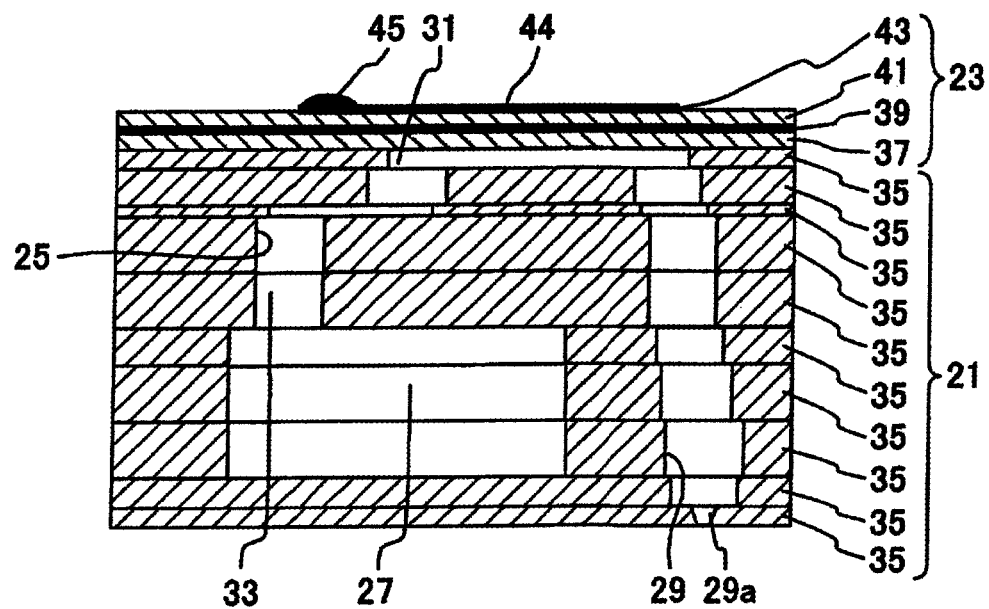
FIG. 2 A cross-sectional view of a portion of an ink jet head of the recording apparatus in FIG. 1.

FIG. 2 is a schematic cross-sectional view which shows a portion of the head 5 enlarged. Note that, the lower part in the sheet in FIG. 2 is the side facing the media 101.

The head 5 is a piezo type head which applies pressure to the ink by mechanical distortion of the piezoelectric element. The head 5 has a plurality of ejection elements 19 for discharging the ink drops. FIG. 2 shows one ejection element 19. The plurality of ejection elements 19 are for example arranged on an xy plane. Each ejection element 19 corresponds to one dot on the media 101.

Further, from another viewpoint, the head 5 has a base 21 (path member) which forms a space for storing ink and a piezoelectric element 23 for applying pressure to the ink stored in the base 21. Although particularly not shown, the base 21 and the piezoelectric element 23 are fastened to each other by an ordinary temperature curable adhesive (for example epoxy resin). The plurality of ejection elements 19 are configured by bases 21 and piezoelectric elements 23.

Inside each base 21, a plurality of individual channels 25 (one is shown in FIG. 2) and a common channel (reservor) 27 communicated with the plurality of individual channels 25 are formed. An individual channel 25 is provided for each ejection element 19, while the common channel 27 is provided common to the plurality of ejection elements 19.

Each individual channel 25 has a descender (partial flow path) 29 including an ejection hole 29a facing the media 101, a pressurizing chamber 31 communicated with the descender 29, and a supply path 33 for communicating the pressurizing chamber 31 and the common channel 27.

The plurality of individual channels 25 and the common channel 27 are filled with ink. By the volume of the plurality of pressurizing chamber 31 changing and pressure being given to the ink, the ink is transmitted from the plurality of pressurizing chambers 31 to the plurality of descenders 29, and a plurality of ink drops are discharged from the plurality of ejection holes 29a. Further, the ink is refilled into the plurality of pressurizing chambers 31 from the common channel 27 through the plurality of supply paths 33.

The cross-sectional shapes or planar shapes of the plurality of individual channels 25 and the common channel 27 may be suitably set. In the present embodiment, each pressurizing chamber 31 is formed to a thickness which is roughly constant in the z-direction and is formed in a roughly diamond shape (see FIG. 3B) when viewed on a plane. One corner of the diamond is communicated with the descender 29, and the corner on the opposite side to that is communicated with the supply path 33. A portion of the supply path 33 is made restrictor an area of which in the cross-section perpendicular to the flow direction is smaller than those of the common channel 27 and pressurizing chamber 31.

The base 21 is configured by for example lamination of a plurality of base plates 35. In the base plates 35, through-holes which configure the plurality of individual channels 25 and common channel 27 are formed. The thicknesses and number of laminations of the plurality of base plates 35 may be suitably set in accordance with the shapes etc. of the plurality of individual channels 25 and common channel 27.

The plurality of base plates 35 may be formed by a suitable material. For example, the plurality of base plates 35 are formed by a metal from the viewpoints of workability, strength, etc. The metal is, preferably, for example stainless steel from the viewpoint of corrosion resistance.

Figure 3A:
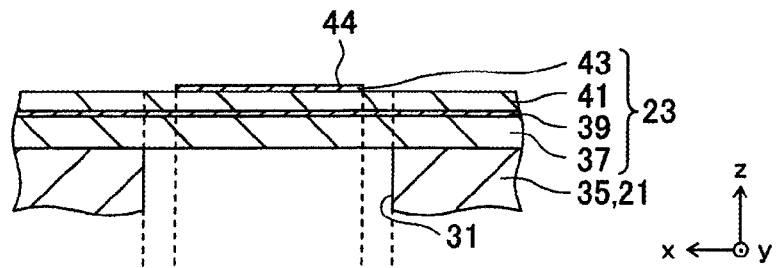
FIG. 3A and FIG. 3B are a cross-sectional view and a plan view which show an actuator of the head in FIG. 2.
Figure 3B:
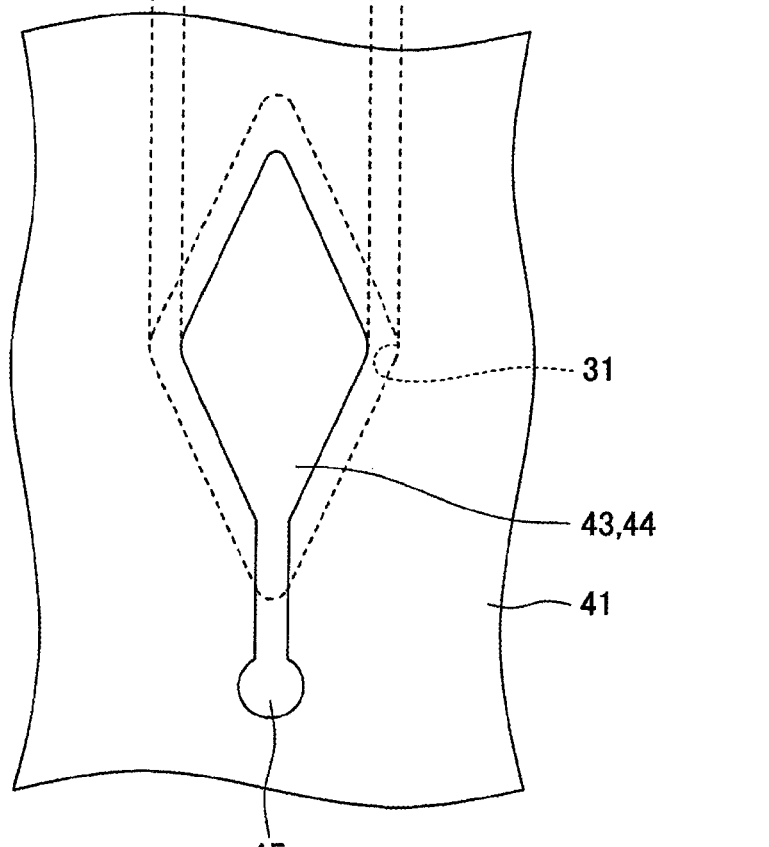

FIG. 3A is a cross-sectional view of the vicinity of the piezoelectric element 23 in a direction different from that in FIG. 2, and FIG. 3B is a plan view of the vicinity of the piezoelectric element 23.

The piezoelectric element 23 shown in FIG. 2 and FIG. 3 is configured by for example a unimorph type piezoelectric element which displaces in a flexure mode. Specifically, for example, the piezoelectric element 23 has a diaphragm 37, a common electrode 39, a piezoelectric body 41, and a plurality of individual electrodes 43 which are laminated in order from the pressurizing chamber 31 side.

The diaphragm 37, the common electrode 39, and the piezoelectric body 41 are for example provided common to the plurality of pressurizing chambers 31 so as to cover the plurality of pressurizing chambers 31. On the other hand, an individual electrode 43 is provided for each pressurizing chamber 31.

The diaphragm 37 is a plate-shaped member having a constant thickness, is superimposed on the upper surface of the base 21 so as to close the concave pressurizing chambers 31, and is fastened to the base 21. The diaphragm 37 is formed by a material having a suitable rigidity (Young's modulus) and is formed by for example a ceramic, silicon oxide, or silicon nitride.

The common electrode 39 is a layer-shaped electrode having a constant thickness, is superimposed on the diaphragm 37, and is fastened to the diaphragm 37. The common electrode 39 is formed by for example silver, platinum, or palladium.

The piezoelectric body 41 is a plate-shaped member having a constant thickness, is superimposed on the common electrode 39, and is fastened to the common electrode 39. The piezoelectric body 41 is formed by for example PZT (lead zirconate titanate) or another ceramic.

Each individual electrode 43 is a layer-shaped electrode having roughly a constant thickness, is superimposed on the piezoelectric body 41, and is fastened to the piezoelectric body 41. The individual electrode 43 includes an individual electrode body 44 which forms roughly the same shape together with the pressurizing chamber 31 (diamond in the present embodiment) when viewed on a plane and is a little bit smaller in width than the pressurizing chamber 31 (expands at the center side of the pressurizing chamber 31) and a leadout electrode 45 which is connected to the corner of that individual electrode body 44. The individual electrode 43 is formed by for example silver, platinum, or palladium.

Note that, as explained above, the base 21 is comprised by a metal, therefore the base 21 has a larger thermal expansion coefficient than the piezoelectric body 41 and consequently has a larger thermal expansion coefficient than the piezoelectric element 23 configured by the piezoelectric body 41 as a principal component. Further, the common electrode 39 and individual electrodes 43 have larger thermal expansion coefficients than the piezoelectric body 41. For example, the thermal expansion coefficient of the PZT (piezoelectric body 41) is 8 ppm/° C., the thermal expansion coefficient of the stainless steel (SUS430 prescribed by the Japanese Industrial Standards (JIS), base 21) is 10 ppm/° C., and the thermal expansion coefficient of an Ag—Pd alloy (70/30 in terms of weight ratio, electrode) is 17 ppm/° C.

Figure 3C:
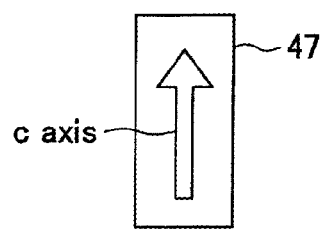
FIG. 3C is a schematic view for explaining a polarization direction of a piezoelectric body of the actuator.

FIG. 3C is a schematic view for explaining a polarization direction of the piezoelectric body 41. Specifically, FIG. 3C schematically shows a representative unit cell (tetragonal crystal 47) of the piezoelectric body 41.

The piezoelectric body 41 is polarized in the thickness direction (z-direction) as indicated by an arrow labeled as the "c axis". Accordingly, when voltage is applied to the common electrode 39 and an individual electrode 43 and an electric field acts upon the piezoelectric body 41 in the polarization direction, the piezoelectric body 41 contracts in the surface direction (in the xy plane). By this contraction, the diaphragm 37 bends so as to protrude toward the pressurizing chamber 31 side. As a result, the volume of the pressurizing chamber 31 changes, pressure is given to the ink in the pressurizing chamber 31, and printing is carried out. Note that, the orientation of the polarization direction may be either of positive side or negative side in the z-direction. In the following description, the explanation will be given by taking as an example a case where the orientation of the polarization direction is the positive side in the z-direction.

Here, the piezoelectric body 41 is ideally a single domain crystal given a direction of spontaneous polarization toward one side of the thickness direction (positive side of z-direction) of the piezoelectric body 41. In reality, however, it is a multi-domain crystal. That is, the orientation of polarization direction being the positive side of the z-direction means that a ratio of the domains given the direction of spontaneous polarization toward (roughly) the positive side of x-direction is higher than any of ratios of domains given directions of spontaneous polarization toward the other directions and/or a ratio of the sum of those and/or that the domains given directions of spontaneous polarization toward other directions become directions and ratios where the polarizations are cancelled by each other.

Each domain is a crystal where the unit cell is regularly arranged in a (roughly) constant orientation. The unit cell causes spontaneous polarization in the unit cell by shifting the center of gravity of positive charges and the center of gravity of negative charges in the predetermined plane direction (including equivalent orientation). Accordingly, from a viewpoint different from that described above, the orientation of polarization direction being the positive side of the z-direction means that the ratio of the unit cells in which the plane direction which becomes the direction of the spontaneous polarization is made to the thickness direction is higher than any of the ratios of the unit cells in which the directions of spontaneous polarization are made other directions and/or the ratio of the sum of those and/or that the unit cells in which the directions of spontaneous polarization are made other directions become directions and ratios where the polarizations are cancelled by each other.

For example, when the piezoelectric body 41 is PZT wherein x of $Zr_xTi_{x-1}$ is less than 0.525 (the boundary of numerical values changes a little according to other additives), the unit cell is a tetragonal crystal. In a tetragonal crystal, the longitudinal direction (c-axis, plane direction [002]) is the direction of spontaneous polarization. Further, in the piezoelectric body 41, the ratio of the tetragonal crystals 47 which are arranged so that the c-axes are oriented toward (roughly) one side of the thickness direction is relatively high. Suitably, the degree of orientation of the c-axis toward one side of the thickness direction is 44% or more and 56% or less in terms of the Lotgering factor.

In the piezoelectric body 41, there is residual stress in the surface direction (direction along the xy plane). Note, the residual stress is made smaller compared with the conventional one as will be explained later. Preferably, the residual stress in the surface direction is 0 MPa or more and 35 MPa or less.

FIG. 4A to FIG. 4E are cross-sectional views corresponding to FIG. 3A which explain an example of the method of production of the head 5. Note, in order to attach arrows indicating directions of the stress, hatchings on the cross-sections are omitted.

First, as shown in FIG. 4A, the base 21 and the piezoelectric element 23 are prepared. The manufacturing methods of these parts may be made the same as known general manufacturing methods.

For example, the base 21 is manufactured by etching or punching a plurality of metal plates to form a plurality of base plates 35 and adhering the plurality of base plates 35 to each other by an adhesive.

Further, for example, the piezoelectric element 23 is manufactured by preparing green sheets which form the piezoelectric body 41 and diaphragm 37, printing conductive pastes which become the common electrode 39 and individual electrodes 43 on these green sheets (for example the green sheet which becomes the piezoelectric body 41), and laminating and firing these green sheets.

Note that, the thermal expansion coefficients of the common electrode 39 and individual electrodes 43 (metal) are higher than the thermal expansion coefficients of the piezoelectric body 41 and diaphragm 37 (ceramic). Accordingly, after these are fastened to each other during firing (in a high temperature state), when the piezoelectric element 23 is made ordinary temperature, the common electrode 39 etc. contract more than the piezoelectric body 41 etc. As a result, as indicated by an arrow y11, in the piezoelectric body 41, compressive stress (residual stress) in the surface direction is generated.

Next, as shown in FIG. 4B, the piezoelectric element 23 and the base 21 are fastened by the adhesive. The fastening is carried out at ordinary temperature by using an ordinary temperature curable adhesive.

Note that, in the present application, "ordinary temperature" designates for example a range of 20° C.±15° C. (5° C. or more and 35° C. or less) which is prescribed in the Japanese Industrial Standards (JIS Z 8703). For most industrial products, use within this range is assumed. This is true also for an ink jet head. Note, in general, when the temperature becomes higher, the viscosity of the ink becomes lower. Therefore, for the purpose of use in a low viscosity state or the like, in an ink jet head, on the high temperature side, sometimes use is made at ordinary temperature or more or, while depending on the solvent of the ink, 70° C. or less. In the ink jet head which is used in that way, bonding may be carried out at the working temperature ±15° C. The product may be cooled and compressive stress may be added after that. Further, in such a case, at the working temperature, the degree of orientation of the c-axis toward one side of the thickness direction in the region sandwiched by the electrodes may be 44% or more and 56% or less in terms of the Lotgering factor, and the residual stress in the surface direction may be 0 MPa or more and 35 MPa or less in the compression direction.

Next, as shown in FIG. 4C, the piezoelectric element 23 and the base 21 are cooled. That is, the temperatures of the piezoelectric element 23 and the base 21 are made temperatures lower than ordinary temperature. The cooling may be carried out according to a suitable method. For example, these members may be arranged in a cooling chamber or cold air may be sent to these members or a bag in which a heat removing agent is sealed may be brought into contact with these members to perform cooling.

When cooled, the members contract. On the other hand, the base 21 (metal) has a higher thermal expansion coefficient compared with the piezoelectric element 23 containing a ceramic as the principal component. Accordingly, as indicated by an arrow y13, the base 21 tries to contract more than the piezoelectric element 23. As a result, as indicated by an arrow y15 which is made larger than the arrow y11 in FIG. 4A and FIG. 4B, the compressive stress of the piezoelectric body 41 becomes larger.

Then, as shown on the right side in FIG. 4C, the tetragonal crystals 47 (domain) change the orientation of the c-axes to a direction perpendicular to the compression direction by 90° by the compressive stress (90° domain switching occurs). Due to this, the degree of orientation of the c-axis toward the thickness direction (up-down direction on the drawing sheet) becomes higher.

Next, as shown in FIG. 4D, the cooling of the piezoelectric element 23 and base 21 is ended (the piezoelectric element 23 and base 21 are made the ordinary temperature). The piezoelectric element 23 and base 21 are made ordinary temperature in the same way as the time of bonding. Therefore, as indicated by the arrow y11 the same as the arrow y11 in FIG. 4B, the compressive stress of the piezoelectric body 41 returns to the magnitude before cooling (even when the stress does not return to a completely original state due to occurrence of domain switching, the difference is small relative to the stress generated due to the temperature change).

Figure 4E:
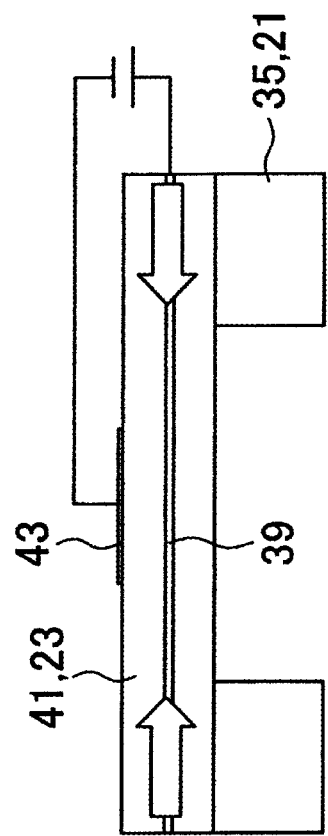

Next, as shown in FIG. 4E, the piezoelectric body 41 is processed to polarize it. Specifically, a DC voltage is applied between the common electrode 39 and an individual electrode 43 by a DC power supply 51. The voltage at this time is made a voltage which forms an electric field having a strength exceeding a coercive electric field of the piezoelectric body 41. More suitably, this is made a voltage not less than the voltage by which the polarization becomes saturated.

Note that, the polarization treatment is for example carried out at ordinary temperature. Further, the order of steps of the bonding and polarization treatment may be reverse as well. However, when the thickness of the piezoelectric element 23 is a thin one of about 100 μm or less, warping occurs in the piezoelectric element 23 due to the polarization treatment, therefore the bonding becomes difficult. Therefore, the order of steps explained above is preferable. Further, the compressive stress which is added to the piezoelectric body 41 is influenced by the structure of the head 5. For example, there is a possibility of occurrence of a difference in the added compressive stress between the piezoelectric body 41 on the pressurizing chamber 10 at the endmost part in the surface direction and the piezoelectric body 41 on the pressurizing chamber 10 between other pressurizing chambers. For this reason, rather than polarization by applying (roughly) uniform polarization, then applying compressive stress and adding variations due to structure, polarization by applying compressive stress, then polarizing so as to form (roughly) uniform polarization including variations occurring at that time is preferred.

The tetragonal crystals 47 (domain) of the piezoelectric body 41 orient the directions of c-axes toward a direction in which the electric field is applied (one side of the thickness direction, positive side of the z-direction) by application of the electric field. That is, the piezoelectric body 41 is polarized while defining one side of the thickness direction as the polarization direction. After that, even after the application of the electric field is suspended, some of the tetragonal crystals 47 remain orienting c-axes toward one side of the thickness direction. That is, the polarization remains.

At this time, since the degree of orientation of the c-axis toward the thickness direction is raised in advance by the cooling treatment (FIG. 4C), it becomes higher compared with the case where the cooling treatment is not carried out. Note that, even in a case where the cooling treatment is carried out after the polarization treatment, in the same way, compared with the case where the cooling treatment is not carried out, the degree of orientation of the c-axis toward the thickness direction becomes higher.

Figure 5:
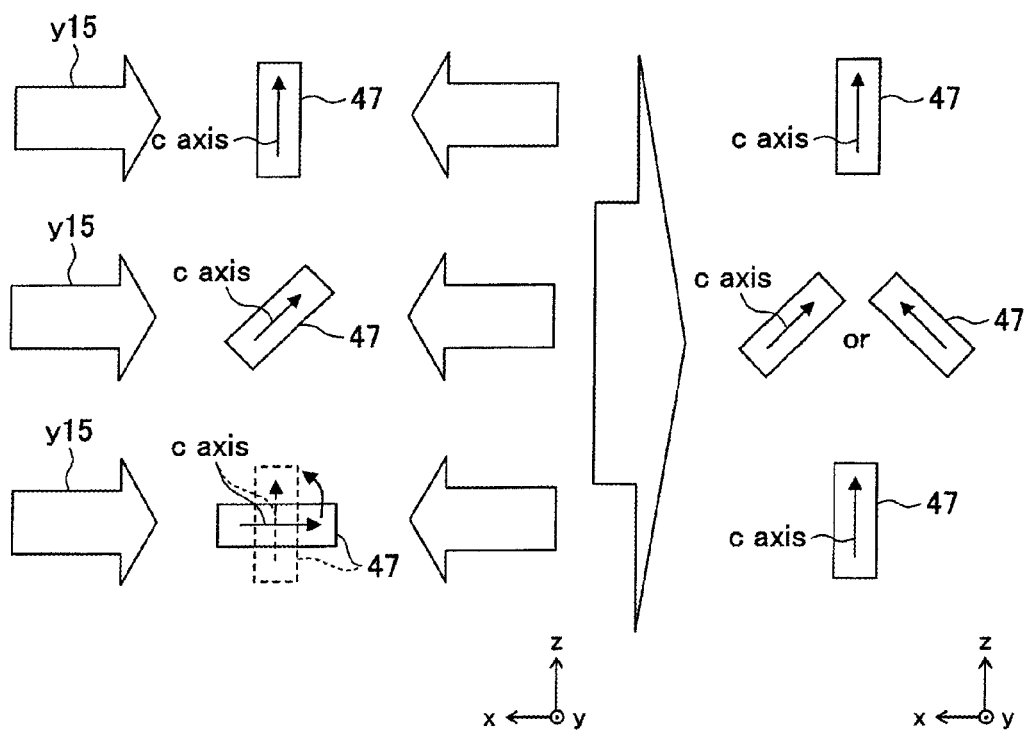
FIG. 5 A conceptual view for explaining domain switching in a cooling treatment in FIG. 4C.

FIG. 5 is a conceptual view for explaining the domain switching in the cooling treatment in FIG. 4C.

As shown on the left side in FIG. 5, before the cooling treatment, in the piezoelectric body 41, the orientations of the c-axes of the plurality of domains (tetragonal crystals 47) are random. Note that, on the left side in FIG. 5, a tetragonal crystal 47 c-axis of which is oriented toward the positive side of the z-direction, a tetragonal crystal 47 c-axis of which is oriented inclined with an angle of 45° relative to the z-direction, and a tetragonal crystal 47 c-axis of which is oriented toward the direction perpendicular to the z-direction are exemplified.

Further, as explained with reference to FIG. 4C, when compressive stress indicated by the arrow y15 occurs due to the cooling treatment, the orientation of the c-axis of each domain becomes as shown on the right side on the drawing sheet in FIG. 5.

For example, the domain c-axis of which was oriented toward the z-direction from the time before the cooling treatment does not change the orientation of the c-axis. Further, the domain c-axis of which was oriented toward the direction perpendicular to the z-direction before the cooling treatment orients the c-axis toward the z-direction due to the occurrence of the 90° domain switching. On the other hand, the domain c-axis of which was oriented inclined by 45° relative to the z-direction before the cooling treatment orients the c-axis inclined by 45° relative to the z-direction even if 90° domain switching occurs.

In this way, the piezoelectric body 41 includes a domain which contributes to an increase of the degree of orientation of the c-axis toward the z-direction due to the 90° domain switching and a domain which does not contribute to the above increase.

Further, as the piezoelectric material for the purpose of an actuator, a material which is generally called as a soft material and has a composition in the vicinity of the morphotropic phase boundary (MPB) is selected. In such a composition, the anisotropy of the tetragonal crystal (c-axis/a-axis) is small.

Due to the orientation of the c-axis toward specific directions being suppressed, after the cooling treatment (FIG. 4C) and polarization treatment (FIG. 4E) are carried out, in a region in which the polarization treatment of the piezoelectric body 41 is carried out (region sandwiched by the common electrode 39 and an individual electrode 43), some of the domains orient the c-axes toward one side of the thickness direction. For example, the degree of orientation of the c-axis toward one side of the thickness direction becomes 44% or more and 56% or less in terms of the Lotgering factor.

Note that, for example, in the case where use is made of TGG (templated grain growth) method or RTGG (reactive templated grain growth) method or other technique in which the degree of orientation toward a specific direction after firing can be made high, the degree of orientation can be made higher than the range described above. Note, the application of such an orientation technique causes an increase of cost.

As explained with reference to FIG. 4B to FIG. 4D, in the present embodiment, the piezoelectric element 23 including the piezoelectric body 41 and the base having a higher thermal expansion coefficient than the piezoelectric element 23 are fastened, then they are cooled down to a temperature lower than ordinary temperature. Due to this, compressive stress is given to the piezoelectric body 41 and the degree of orientation of the c-axis toward the z-direction is made high. That degree of orientation is maintained even when the cooling treatment is ended.

Figure 6A:
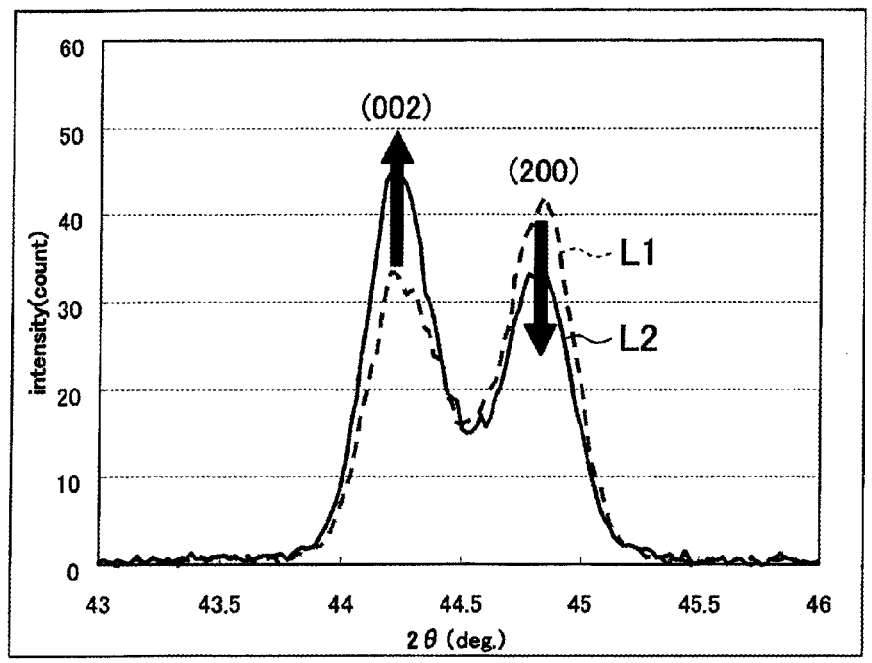
FIG. 6A and FIG. 6B are graphs for explaining a change of a degree of orientation and fastening according to a compressive stress.
Figure 6B:
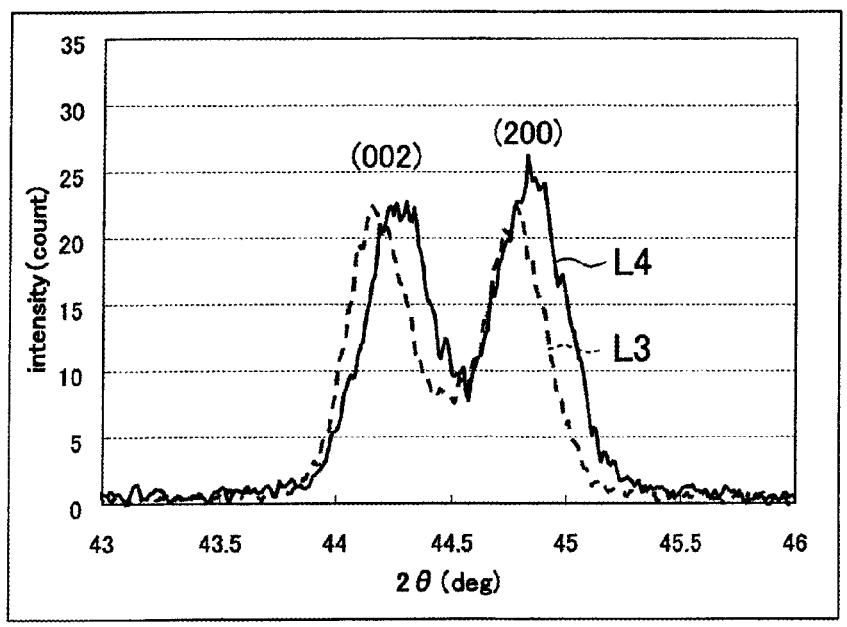

FIG. 6A and FIG. 6B are graphs which show evidence that the degree of orientation changes due to the compressive stress, and the degree of orientation is maintained even when the compressive stress is removed after that.

Note that, these graphs are for showing that the degree of orientation which changed due to the compressive stress is maintained even after the removal of the compressive stress, therefore, the manufacturing method of samples is different from the manufacturing method of the present embodiment. However, for convenience in explanation, notations in the present embodiment will be sometimes utilized. This is true also for comparative examples which will be explained later.

FIG. 6A and FIG. 6B show examples of results of XRD (X-ray diffraction (method)) with respect to the major surface of the piezoelectric body 41.

In this XRD, X-rays are applied to the major surface of the piezoelectric body 41, and the intensity I of the reflected X-rays is measured. The irradiation angle θ (°) of the X-rays with respect to the major surface in a side view of the major surface is changed. In FIG. 6A and FIG. 6B, the abscissas show 2θ(°), and ordinates show the intensities I.

In XRD, there is a peak of the intensity I at the value of 2θ corresponding to each crystal plane. In FIG. 6A and FIG. 6B, assuming that the crystal structure of the piezoelectric body 41 is a tetragonal crystal, the intensities I in the vicinity of the value of 2θ corresponding to the (002) plane and (200) plane are shown.

In FIG. 6A, a line L1 indicates the XRD results before bonding of the piezoelectric element 23 to the base 21, and a line L2 indicates the XRD results after bonding of the piezoelectric element 23 to the base 21.

The piezoelectric element 23 and the base 21 were bonded by using a thermosetting resin at a temperature of 125° C. unlike the present embodiment, while the XRD was measured at ordinary temperature. Accordingly, after bonding, when the temperature falls to one within the range of the ordinary temperature, by contraction of the base 21 more than the piezoelectric element 23, compressive stress is generated in the piezoelectric body 41.

That is, the line L1 indicates the degree of orientation before compressive stress is generated, and the line L2 indicates the degree of orientation after compressive stress is generated.

As indicated by the lines L1 and L2, when compressive stress is generated, at 2θ corresponding to the (002) plane, the intensity I becomes high. At 2θ corresponding to the (200) plane, the intensity I becomes low. That is, according to the compressive stress, domain switching directing the c-axis toward the z-direction occurs.

In FIG. 6B, a line L3 indicates the XRD results in a state where the piezoelectric element 23 and the base 21 are adhered, and a line L4 indicates the XRD results after the piezoelectric element 23 is peeled off from the base 21. That is, the line L3 indicates the degree of orientation in a state where compressive stress is generated, and the line L4 indicates the degree of orientation in a state where that compressive stress is removed.

Note that, the line L3 in FIG. 6B, in the same way as FIG. 6A, also indicates the results when the piezoelectric element 23 and the base 21 were adhered at a high temperature by using a thermosetting resin and the XRD was measured at ordinary temperature, but the conditions are different from FIG. 6A, so this does not coincide with the line L2.

The piezoelectric element 23 was peeled off (correctly speaking, the piezoelectric body 41 was peeled off at the common electrode 39 section) by dipping the piezoelectric element 23 and the base 21 in an aqueous solution of 1 mol/NaCl and applying DC voltage (voltage within the withstand voltage) to the common electrode 39 and individual electrode 43 by a W probe so that no load was applied to the piezoelectric body 41 from the outside in the peeling process.

As indicated by the lines L3 and L4, even when the piezoelectric element 23 is peeled off from the base 21 and the compressive stress is removed from the piezoelectric element 23, the intensity I at 2θ corresponding to the (200) plane and (002) plane does not greatly change. That is, the degree of orientation which changed due to the compressive stress is maintained even when the compressive stress is removed.

As described above, in the present embodiment, by the cooling treatment, the degree of orientation of the c-axis toward the z-direction is made high. As a result, variation in displacement is suppressed. Further, they are adhered at ordinary temperature, therefore application of compressive stress from the base 21 to the piezoelectric element 23 at the ordinary temperature is suppressed, so a drop of displacement is suppressed. In the following description, the effects will be explained with reference to the examples and comparative examples.

Examples and Comparative Examples

FIG. 7 and FIG. 14 are tables which show the conditions and modes of operation etc. of the examples and comparative examples.

The columns of "No." indicate numbers which are suitably attached to the examples and comparative examples. As shown in the columns, in the examples and comparative examples, 40 samples (ones obtained by bonding the piezoelectric element 23 and base 21) from No. 1 to No. 40 were manufactured, and various measurements were carried out. Note that, in "No. 1", as the sample, use is made of a piezoelectric body 41 before it was adhered to the base 21, and some of the conditions or modes of operation are not described.

The columns of "EXAMPLE" and "COMPARATIVE EXAMPLE" indicate examples or comparative examples. That is, in the examples, circle or triangle marks are entered in the columns of "EXAMPLE", and circles are entered in columns of "COMPARATIVE EXAMPLE" in the case of comparative examples. Note that, the difference between the circles and the triangles in the columns of "EXAMPLE" will be explained later.

(Conditions Different for Examples and Comparative Examples)

In FIG. 7 and FIG. 14, the columns of "Zr/Ti", "T1(° C.)", "T2(° C.)", and "ΔT(° C.)" indicate the conditions set for the examples and comparative examples. Note that, the same conditions are set between some examples or some comparative examples. The columns concretely indicate the following conditions.

The column of "Zr/Ti" indicates the conditions of the material of the piezoelectric body 41. The material of the piezoelectric body 41 was made, among ones represented by $Pb_{1-x-y}Sr_xBa_y(Zn_{1/3}Sb_{2/3})_a(Ni_{1/2}Te_{1/2})_bZr_{1-a-b-c}Ti_cO_3+\alpha wt\% Pb_{1/2}NbO_3$ (0≤x≤0.14, 0≤y≤0.14, 0.05≤a≤0.1, 0.002≤b≤0.01, 0.44≤c≤0.50, a is 0.1 or more and 1.0 or less), a material in which (1−a−b−c)/c becomes 0.5/0.5 or 0.495/0.505. In the columns of "Zr/Ti", values of (1−a−b−c)/c are shown.

The columns of "T1(° C.)" indicate the conditions of the temperature of the atmosphere (consequently the temperatures of the piezoelectric element 23 and base 21) when the piezoelectric element 23 and the base 21 were adhered. As indicated in these columns, various bonding temperatures T1 were set within a range of 25 to 120° C.

The columns of "T2(° C.)" indicate the conditions of the minimum temperature of the piezoelectric element 23 and the base 21 after bonding. Note that, in the examples, the conditions of temperature at the time of the cooling treatment (FIG. 4C) are shown. As indicated in these columns, various minimum temperatures T2 are set within a range of −70 to 0° C. which is lower than ordinary temperature (5° C. or more and 35° C. or less) in the examples, while are set within the range of ordinary temperature (mainly 25° C.) in the comparative examples.

The columns of "ΔT(° C.)" indicate differences between the bonding temperatures T1 and the minimum temperatures T2 (T2−T1). As shown in these columns, various temperature differences ΔT are set at 0 to 180° C.

(Modes of Operation of Examples and Comparative Examples)

In FIG. 7 and FIG. 14, the columns of "σ(MPa)", "(002)/{(200)+(002)}", "LF(%)", "(D(nm)", and "V(%)" indicate the measurement results of values which show the modes of operation for the examples and comparative examples. Specifically, these are as follows. Note that, the various types of measurement values which will be explained below were obtained in a state where the piezoelectric element 23 and the base 21 were adhered. Further, regarding the measurement temperature, in FIG. 7, all values were obtained at ordinary temperature (concretely about 25° C.). In FIG. 14, "σ(MPa)", "(D(nm)", and "V(%)" were obtained at 45° C. and the others were obtained at ordinary temperature.

The columns of "σ(MPa)" indicate the measurement results of the compressive stress which is generated in the piezoelectric body 41. The compressive stress was measured according to the full Debye ring fitting 2D process. This measures the XRD in a state where stress is applied to a sample having the same composition as the target and measures the XRD of the sample as the target to thereby measure the compressive stress based on distortion of the crystal cell due to stress. Note that, the numerical values in the columns are given minus marks corresponding to stress being applied in the compression direction.

The columns of "(002)/{(200)+(002)}" indicate the values obtained by dividing the intensity I of the (002) plane measured according to XRD in the same way as FIG. 6 by the intensity I of the (200) plane and (002) plane (one type of index showing the degree of orientation).

The columns of "LF(%)" indicate the degrees of orientation of the c-axis toward one side of the thickness direction in the piezoelectric body 41. Specifically, these columns indicate the Lotgering factors calculated based on the intensities I measured according to XRD.

Note that, as the XRD measurement apparatus, use was made of a "D8 DISCOVER with GADD Super Speed" made by Bruker AXS Corporation. Further, the Lotgering factors "LF(%)" were found in the following way.

$$LF(\%)=\{(\rho-\rho_0)/(1-\rho_0)\}\times 100$$

$$\rho_0=\Sigma I_0(001)/\Sigma I_0(hkl)$$

$I_0$: X-ray diffraction intensities of non-oriented sample
$\Sigma I_0$ (hkl): Sum of all diffraction intensities of X-ray diffraction of non-oriented sample
$\Sigma I_0$ (001): Sum of diffraction intensities of all planes vertical to the c-axis in the X-ray diffraction of the non-oriented sample $$\rho=\Sigma I(001)/\Sigma I(hkl)$$

I: Intensity of X-ray diffraction of measurement target sample
$\Sigma I(hkl)$: Sum of all diffraction intensities of X-ray diffraction of measurement target sample
$\Sigma I(001)$: Sum of diffraction intensities of all planes vertical to the c-axis in the X-ray diffraction of measurement target sample The columns of "D(nm)" indicate displacements at the center position of the piezoelectric element 23 when voltage is applied to between the common electrode 39 and an individual electrode 43 and the piezoelectric element 23 is bent.

The columns of "V(%)" indicate the variations of the displacement D described above among a plurality of ejection elements 19. Specifically, the displacement variation V indicates the standard deviation D$\sigma$ of the displacement D.

(Conditions Common to Examples and Comparative Examples and Other Conditions)

The conditions common to the examples and comparative examples are as follows.

Piezoelectric body 41
 Thickness: 20 µm
Diaphragm 37
 Material: PZT ceramic
 Thickness: 20 µm
Common electrode 39
 Material: Ag—Pd alloy (70/30 in terms of weight ratio)
 Thickness: 2 µm
Individual electrode 43
 Material: Ag—Pd alloy (70/30 in terms of weight ratio)
 Thickness: 0.4 µm
Base 21
 Material: SUS430 (stainless steel). Note, No. 31 is 42 alloy.
 Thickness: 1 mm
Pressurizing chamber 31
 Shape and dimension when viewed on a plane
  Length of long diagonal line: 800 µm
  Length of short diagonal line: 500 µm
  Height: 50 µm
Applied voltage at time of polarization: 40V
Applied voltage at measurement of displacement: 20V
Note that, in No. 2 to No. 28 and No. 31 to No. 40, the polarization treatment is carried out by applying voltage between the common electrode 39 and an individual electrode 43 as explained in the embodiments.

In No. 29, the polarization treatment was carried out by forming a temporary electrode for polarization on the major surface of the piezoelectric body 41 and applying voltage between that temporary electrode and the common electrode 39. Accordingly, the piezoelectric body 41 was polarized in the thickness direction over its entire surface. Note that, the temporary electrode was removed after the polarization treatment.

In No. 30, the polarization treatment was carried out by forming a temporary electrode for polarization on the periphery of an individual electrode 43, applying voltage between the common electrode 39 and the individual electrode 43, and applying voltage between the individual electrode 43 and the temporary electrode. Accordingly, the piezoelectric body 41 was polarized in the surface direction on the periphery of the individual electrode 43. Note that, the temporary electrode was removed after the polarization treatment.

(Considerations for Examples and Comparative Examples)

For most of the examples and the comparative examples, the conditions of the production method differ only in the bonding temperature T1, the minimum temperature T2, and the temperature difference $\Delta$T. On the other hand, in the examples and the comparative examples, the displacements D and the displacement variations V are different from each other. That is, the bonding temperature T1, the minimum temperature T2, and the temperature difference $\Delta$T exert influences upon the displacements D and the displacement variations V.

In the following description, based on the numerical values in FIG. 7, correlations between the temperature etc. and the displacement etc. will be shown, and the influence of the temperature exerted upon the displacement and the reason for that will be explained. Note that, the following correlation diagrams of FIG. 8 to FIG. 13 cover No. 2 to No. 28 in which the conditions other than the temperature are the same.

Figure 8A:
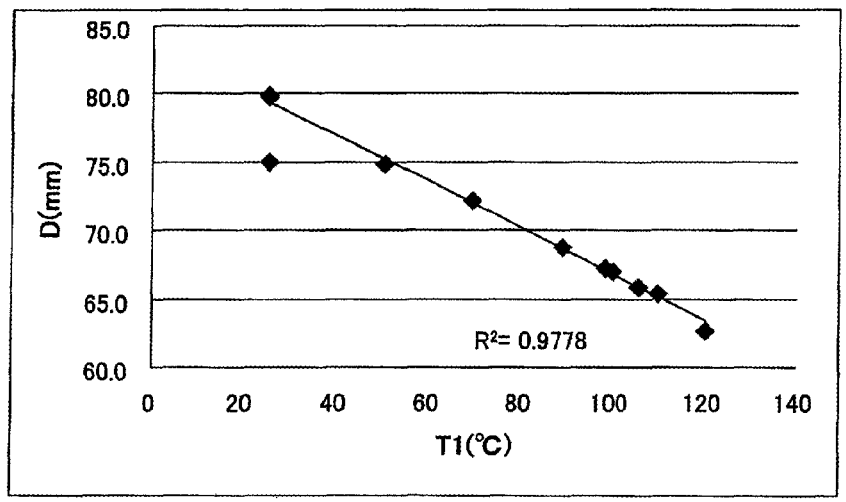
FIG. 8A is a graph which shows correlation between a bonding temperature and displacement.
Figure 8B:
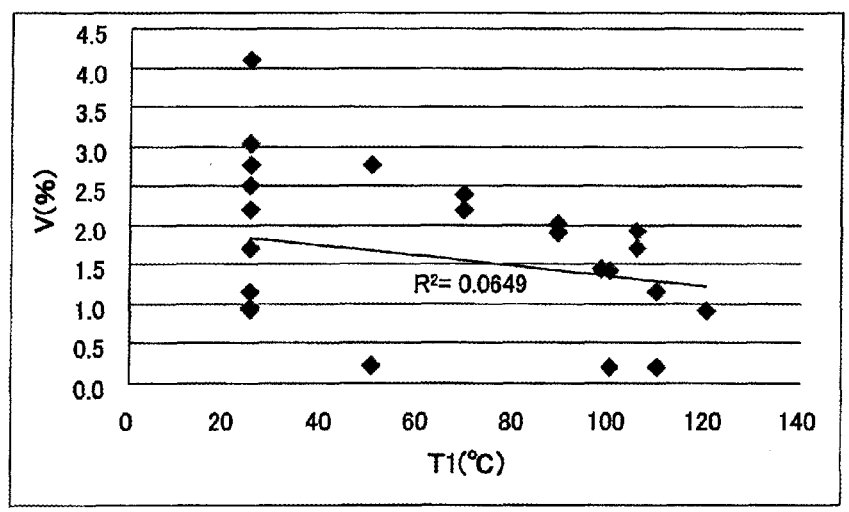
FIG. 8B is a graph which shows correlation between the bonding temperature and variation in displacement.

FIG. 8A is a graph which shows correlation between the bonding temperature T1 and the displacement D in which the abscissa shows the bonding temperature T1, and the ordinate shows the displacement D. Further, FIG. 8B is a graph which shows correlation between the bonding temperature T1 and the displacement variation V in which the abscissa shows the bonding temperature T1, and the ordinate shows the displacement variations V.

As shown in these graphs, the correlation is extremely high ($R^2$=0.98) between the bonding temperature T1 and the displacement D, while the correlation is extremely low ($R^2$=0.06) between the bonding temperature T1 and the displacement variation V. Further, the lower (the nearer the ordinary temperature) the bonding temperature T1, the larger the displacement D.

Figure 9A:
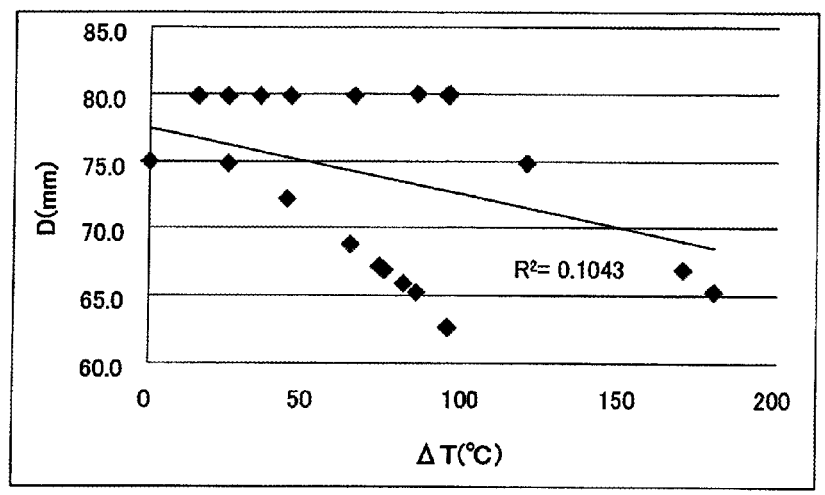
FIG. 9A is a graph which shows correlation between a temperature difference and displacement.
Figure 9B:
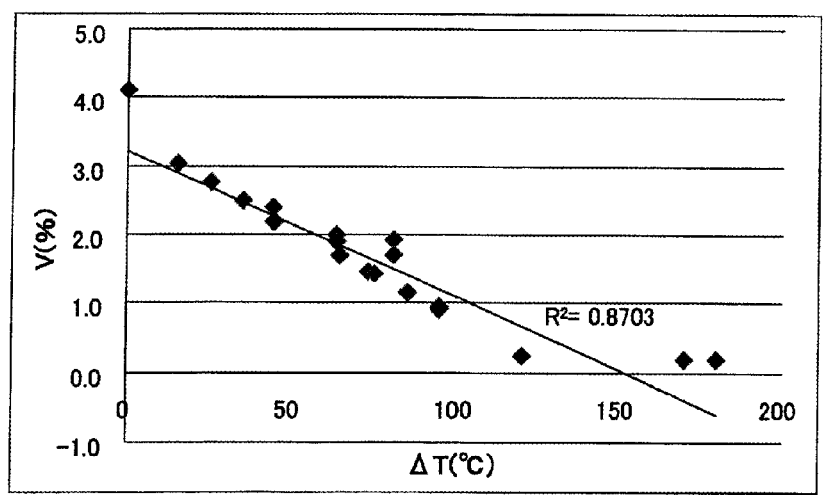
FIG. 9B is a graph which shows correlation between the temperature difference and variation in displacement.

FIG. 9A is a graph which shows correlation between the temperature difference $\Delta$T and the displacement D in which the abscissa shows the temperature difference $\Delta$T, and the ordinate shows the displacement D. Further, FIG. 9B is a graph which shows correlation between the temperature difference $\Delta$T and the displacement variation V in which the abscissa shows the temperature difference $\Delta$T, and the ordinate shows the displacement variation V.

As shown in these graphs, the correlation is extremely low ($R^2$=0.10) between the temperature difference $\Delta$T and the displacement D, while the correlation is extremely high ($R^2$=0.87) between the temperature difference $\Delta$T and the displacement variation V. Further, the larger the temperature difference $\Delta$T, the smaller the displacement variation V.

As described above, the displacement D largely depends upon the bonding temperature T1. The reason for this is considered that, as already explained, when the bonding temperature T1 is high, at ordinary temperature, compressive stress is generated in the piezoelectric body 41 due to the contraction of the base 21, so the piezoelectric constant of the piezoelectric body 41 becomes low. Further, the displacement variation V largely depends upon the temperature difference ΔT. The reason for this is considered that, if the temperature difference ΔT is large, as explained with reference to FIG. 4C, compressive stress in the surface direction is generated in the piezoelectric body 41, therefore the degree of orientation of the c-axis toward the thickness direction becomes high. Hereinafter, correlation diagrams for confirming these modes of operation will be shown.

Figure 10A:
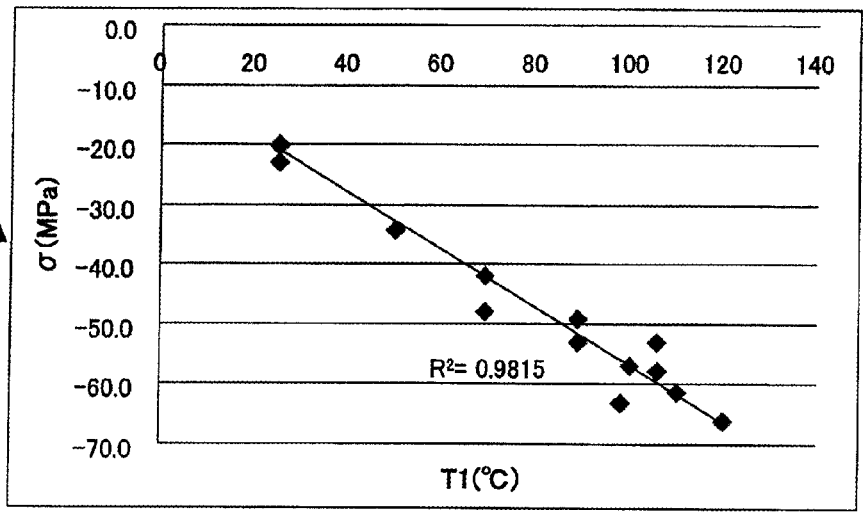
FIG. 10A is a graph which shows correlation between the bonding temperature and compressive stress.
Figure 10B:
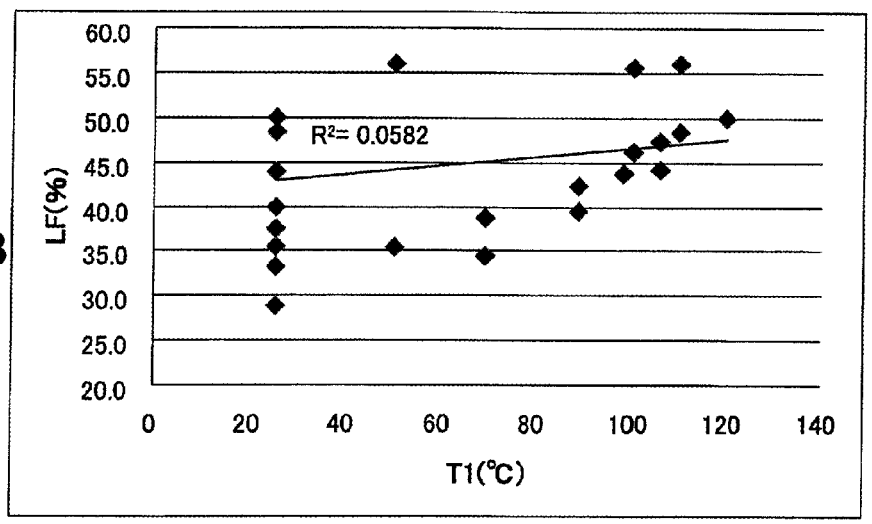
FIG. 10B is a graph which shows correlation between the bonding temperature and a degree of orientation.

FIG. 10A is a graph which shows correlation between the bonding temperature T1 and the compressive stress σ in which the abscissa shows the bonding temperature T1, and the ordinate shows the compressive stress σ. Further, FIG. 10B is a graph which shows correlation between the bonding temperature T1 and an orientation degree LF of the c-axis toward the thickness direction in which the abscissa shows the bonding temperature T1, and the ordinate shows the orientation degree LF.

As shown in these graphs, the correlation is extremely high ($R^2=0.98$) between the bonding temperature T1 and the compressive stress σ, while the correlation is extremely low ($R^2=0.06$) between the bonding temperature T1 and the orientation degree LF. Further, the lower (the nearer the ordinary temperature) the bonding temperature T1, the smaller the compressive stress σ.

Figure 11A:
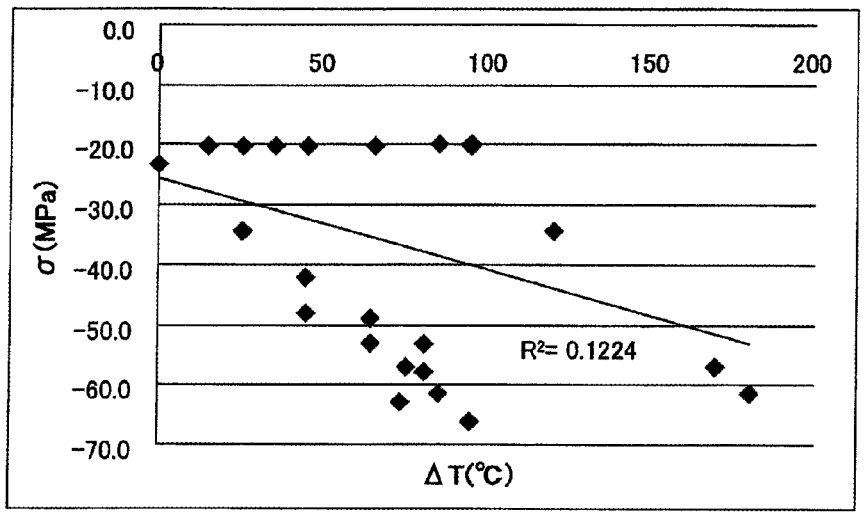
FIG. 11A is a graph which shows correlation between the temperature difference and compressive stress.
Figure 11B:
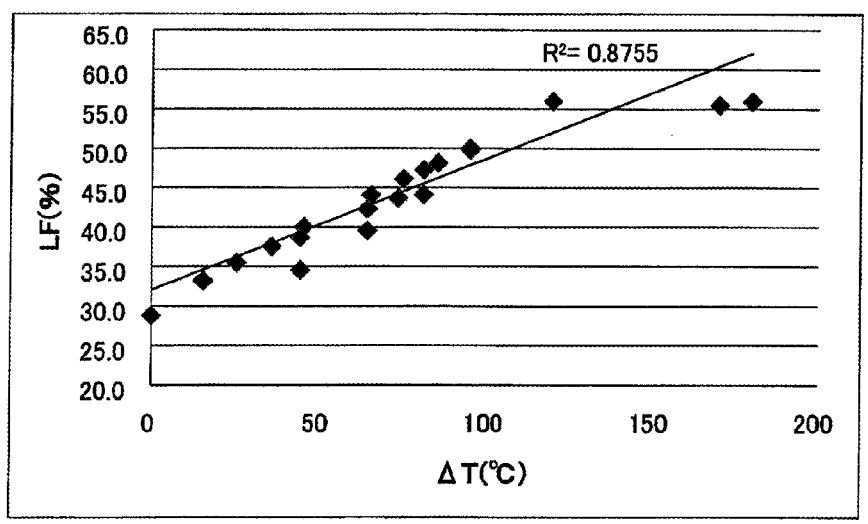
FIG. 11B is a graph which shows correlation between the temperature difference and the degree of orientation.

FIG. 11A is a graph which shows correlation between the temperature difference ΔT and the compressive stress σ in which the abscissa shows the temperature difference ΔT, and the ordinate shows the compressive stress σ. Further, FIG. 11B is a graph which shows correlation between the temperature difference ΔT and the orientation degree LF of the c-axis toward the thickness direction in which the abscissa shows the temperature difference ΔT, and the ordinate shows the orientation degree LF.

As shown in these graphs, the correlation is extremely low ($R^2=0.12$) between the temperature difference ΔT and the compressive stress σ, while the correlation is extremely high ($R^2=0.88$) between the temperature difference ΔT and the orientation degree LF. Further, the larger the temperature difference ΔT, the higher the orientation degree LF.

Figure 12A:
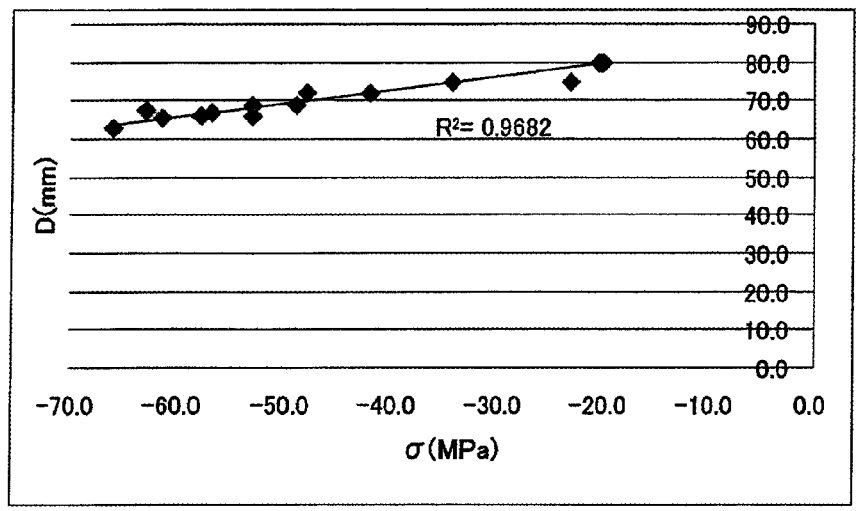
FIG. 12A is a graph which shows correlation between compressive stress and displacement.
Figure 12B:
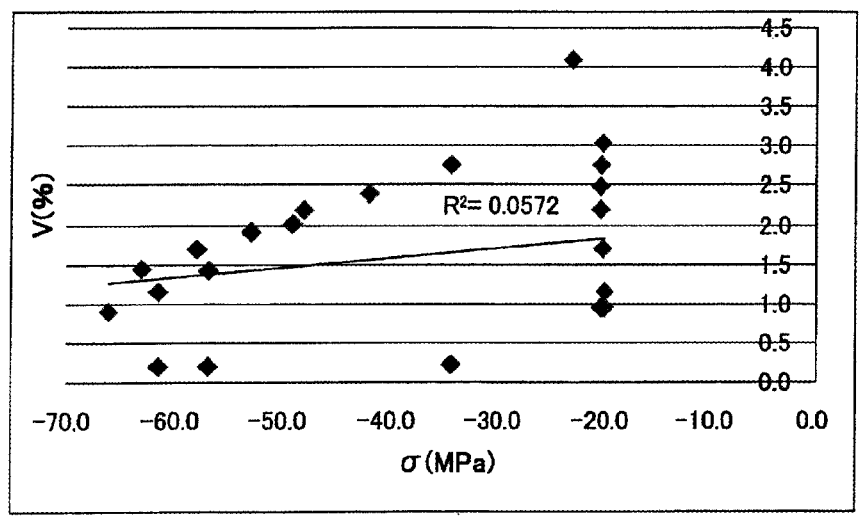
FIG. 12B is a graph which shows correlation between the compressive stress and variation in displacement.

FIG. 12A is a graph which shows correlation between the compressive stress σ and the displacement D in which the abscissa shows the compressive stress σ, and the ordinate shows the displacement D. Further, FIG. 12B is a graph which shows correlation between the compressive stress σ and the displacement variation V in which the abscissa shows the compressive stress σ, and the ordinate shows the displacement variation V.

As shown in these graphs, the correlation is extremely high ($R^2=0.97$) between the compressive stress σ and the displacement D, while the correlation is extremely low ($R^2=0.06$) between the compressive stress σ and the displacement variation V. Further, the smaller the compressive stress σ, the larger the displacement D.

Figure 13A:
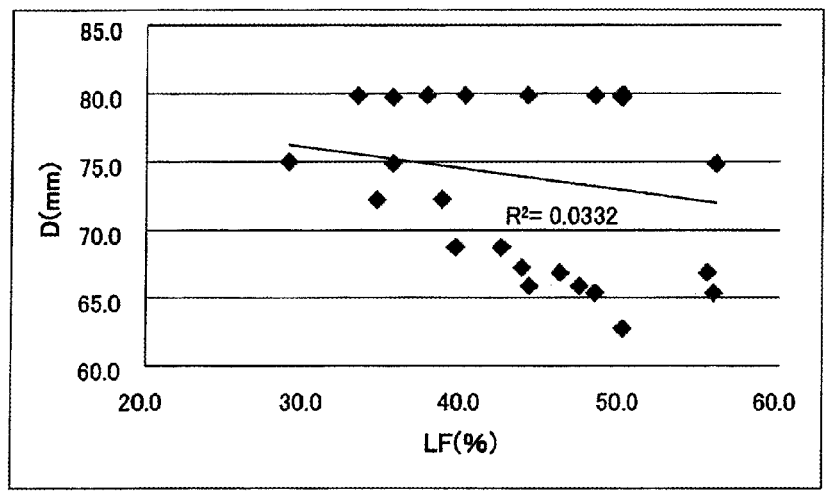
FIG. 13A is a graph which shows correlation between the degree of orientation and displacement.
Figure 13B:
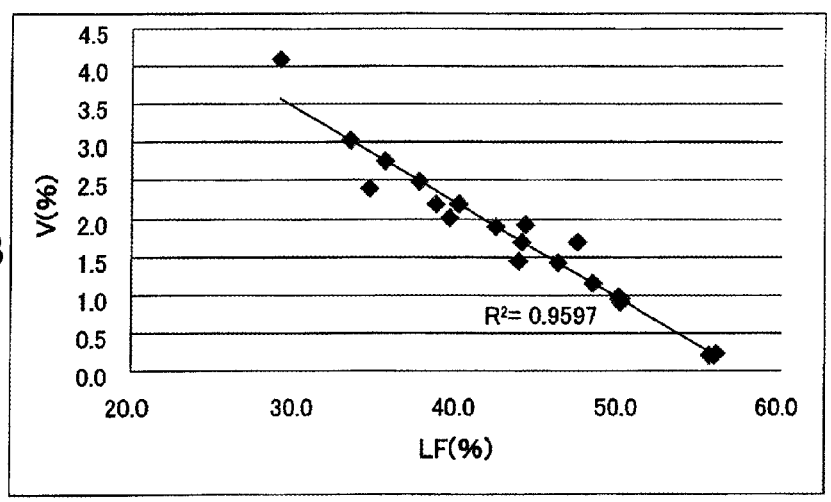
FIG. 13B is a graph which shows a correlation between the degree of orientation and variation in displacement.

FIG. 13A is a graph which shows correlation between the orientation degree LF of the c-axis toward the thickness direction and the displacement D in which the abscissa shows the orientation degree LF, and the ordinate shows the displacement D. Further, FIG. 13B is a graph which shows correlation between the orientation degree LF and the displacement variation V in which the abscissa shows the orientation degree LF, and the ordinate shows the displacement variation V.

As shown in these graphs, the correlation is extremely low ($R^2=0.03$) between the orientation degree LF and the displacement D, while the correlation is extremely high ($R^2=0.96$) between the orientation degree LF and the displacement variation V. Further, the higher the orientation degree LF, the smaller the displacement variation V.

As described above, in the method of production, by suitably setting the bonding temperature T1, minimum temperature T2, and temperature difference ΔT, the displacement variation V can be made small while securing a large displacement D. Further, from another viewpoint, in the product, by suitably setting the orientation degree LF and compressive stress σ, the displacement variation V can be made small while securing a large displacement D. A preferred range of that is as follows.

No. 2 is a comparative example in which bonding was carried out at ordinary temperature, then cooling treatment was not carried out (ΔT=0° C.). The displacement variation V of that is 4.1%. Contrary to this, in No. 17 in which the bonding was carried out at ordinary temperature and the cooling was carried out within the range of ordinary temperature, the displacement variation V is 3.0%. Further, in No. 18 in which the bonding was carried out at ordinary temperature and cooling to a temperature a bit lower than ordinary temperature was carried out, the displacement variation V is 2.8%. The displacement variations V in both of No. 17 and No. 18 are smaller than the displacement variation V in No. 2.

Accordingly, so long as the cooling treatment is carried out, although the extent is small, the effect of reducing the variation in displacement V is obtained. Considering the fact that handling within the range of ordinary temperature is assumed for the product, if treatment for cooling to a temperature lower than ordinary temperature is carried out, an effect which is not exerted in a usual product can be obtained.

Further, from the viewpoint of obtaining a displacement variation V (about 2%) which is equal to that in the comparative examples (for example, No. 3 to No. 10) in which the displacement variations V are made small by bonding at a high temperature and giving compressive stress in the process of transition from a high temperature to ordinary temperature, as shown in No. 21, preferably the temperature difference ΔT is made 65° C. or more (if bonding at ordinary temperature, it is cooled up to −40° C. or less).

Further, from the viewpoint of not only making the displacement variation V smaller, but also making the displacement D larger than those in the comparative examples in which the bonding is carried out at a high temperature, the bonding is preferably carried out at ordinary temperature and a temperature close to ordinary temperature (for example 50° C. or less. See No. 26). More preferably, the bonding is carried out at a temperature within a range of ordinary temperature.

In the examples in which the displacements D are made larger than those in the comparative examples while making the displacement variations V smaller equally with the comparative examples, concerning the characteristic features which appear in the products, the orientation degrees LF of the c-axis toward the thickness direction in the piezoelectric body 41 is 44% (see No. 21) or more and 56% (see No. 26) or less, and the compressive stresses a in the surface direction of the piezoelectric body 41 are 0 MPa or more and 35 MPa (see No. 26) or less.

Note that, in the column of "EXAMPLE" in FIG. 7, among the examples, circles are attached to examples satisfying the conditions of the orientation degree LF and compressive stress σ, and triangles are attached to examples other than the former ones.

In the above embodiments etc., the combination of the piezoelectric element 23 and the base 21 is one example of the piezoelectric actuator.

The present invention is not limited to the above embodiments and may be executed in various ways.

The piezoelectric actuator is not limited to one used in an ink jet head and may be one used for various applications. Further, the piezoelectric element is not limited to a unimorph type and may for example be a bimorph type as well. For the deformation mode of piezoelectric as well, $d_{33}$ other than $d_{31}$ or one using a shear mode may be employed.

The piezoelectric actuator can be used for other than an ink jet head, for example, a piezoelectric speaker, a source of vibration for transmitting the sense of touch in a display device equipped with a touch sensor or the like, and a source of vibration for transmitting audio information by making the display device such as a mobile phone contact an ear or other portion of the human body and giving vibration and so on. In all of such forms, the piezoelectric element is superimposed in the thickness direction with respect to the flat plate-shaped base and fastened.

In the piezoelectric speaker, the base is a film made of resin such as polyethylene, polyimide or polypropylene or metal. Basically use is made of one having a larger thermal expansion coefficient than a piezoelectric element. The film may be spread in a frame that becomes the fastening end of vibration of the film. The piezoelectric element is basically fastened at the center part of the film so that the vibration of the film can be made larger. It is also possible to make a portion of the display device vibrate and act as the piezoelectric speaker. An explanation of this will be given next together with the other forms.

The transmission of the sense of touch in the display device equipped with a touch sensor means for example transmitting the fact of detection of depression when a finger etc. pushes a liquid crystal touch panel etc., by vibration etc. to the finger. According to the method of vibration, a feeling can be generated like if a button were pushed. In audio information transmission by vibration by touch, for example, by making the liquid crystal panel or the like vibrate, vibration is given to outer ears etc. so that it is perceived by the inner ears as sound. This can be used in place of sound transmitted by vibration of air or can be used to assist sound which is transmitted by vibration of air. In any case, it can be realized by fastening the piezoelectric element on a base which is a part of a display device such as a liquid crystal panel and making this vibrate.

In a display device such as a liquid crystal panel, the base is glass or acrylic resin. They basically have a larger thermal expansion coefficient than a piezoelectric element. Among the glass to be used, there are ones having low thermal expansion coefficients. However, in such a case, a member having a high thermal expansion coefficient such as a metal plate may be inserted between the glass and the piezoelectric element so that a compressive stress is applied to the piezoelectric element.

As the base, for example, use can be made of one having a thickness of 0.1 mm or more and 2.0 mm or less and a size of a few centimeters to several tens of centimeters. In a case where the product is used as a liquid crystal panel etc., the center part is used for realizing other functions in many cases, therefore a piezoelectric element is basically fastened near an end part of the base. As the size of the piezoelectric element, for example, use can be made of one having a thickness of 0.1 or more and 1.0 mm or less, a length of 10 mm or more and 50 mm or less, and a width of 1.0 mm or more and 10.0 mm or less. In the piezoelectric element, the size in one of directions along the base is preferably larger than the thickness (height from the base) so that the stress from the base is easily added to the entire piezoelectric element. Further, preferably the sizes in the all directions along the base are larger than the thickness.

The material of the piezoelectric body is not limited to PZT and has only to be a material with which a 90° domain switch occurs due to compressive stress. For example, it may be a material containing a tetragonal principal crystal phase. Further, in a case where the material of the piezoelectric body is one represented by $Pb_{1-x-y}Sr_xBa_y(Zn_{1/3}Sb_{2/3})a(Ni_{1/2}Te_{1/2})_b Zr_{1-a-b-c}Ti_cO_3 + \alpha wt\ \%\ Pb_{1/2}NbO_3$ ($0 \leq x \leq 0.14$, $0 \leq y \leq 0.14$, $0.05 \leq a \leq 0.1$, $0.002 \leq b \leq 0.01$, $0.44 \leq c \leq 0.50$, a is 0.1 or more and 1.0 or less), $(1-a-b-c)/c$ may be suitably set. For example, it may be a value between 0.5/0.5 and 0.49/0.505 shown in the examples as well.

The piezoelectric body need only satisfy the conditions of the degree of orientation or compressive stress in at least a region sandwiched by a pair of electrodes (common electrode and individual electrode). For example, in the region within the region superimposed on the pressurizing chamber and becomes the outside of the individual electrode body, the piezoelectric body may be polarized in the surface direction, may be polarized in the thickness direction or may not be polarized.

REFERENCE SIGNS LIST 5,6 . . . heads (piezoelectric actuators), 21 . . . base, 39 . . . common electrode, 41 . . . piezoelectric body, and 43 . . . individual electrode.

The invention claimed is:

1. A piezoelectric actuator comprising:
a base and
a piezoelectric element which
has a plate-shaped piezoelectric body and a pair of electrodes arranged so as to sandwich the piezoelectric body in a thickness direction and
is superimposed on and fastened to the base in the thickness direction, wherein
the base has a higher thermal expansion coefficient than the piezoelectric element, and
the piezoelectric body has a tetragonal principal crystal phase, in which the degree of orientation of the c-axis toward one side in the thickness direction in the region sandwiched by the pair of electrodes is 44% or more and 56% or less in terms of the Lotgering factor and in which the residual stress in the surface direction is 0 MPa or more and 35 MPa or less in the direction of compression.

2. The piezoelectric actuator as set forth in claim 1, wherein the material of the piezoelectric body contains lead zirconate titanate as a principal ingredient.

3. The piezoelectric actuator as set forth in claim 2, wherein the material of the piezoelectric body is one satisfying $0.495/0.505 \leq (1-a-b-c)/c \leq 0.5/0.5$ among materials represented by $Pb_{1-x-y}Sr_xBa_y(Zn_{1/3}Sb_{2/3})_a(Ni_{1/2}Te_{1/2})_b Zr_{1-a-b-c}Ti_cO_3 + \alpha wt\ \%\ Pb_{1/2}NbO_3$ ($0 \leq x \leq 0.14$, $0 \leq y \leq 0.14$, $0.05 \leq a \leq 0.1$, $0.002 \leq b \leq 0.01$, $0.44 \leq c \leq 0.50$, a is 0.1 or more and 1.0 or less).

4. An ink jet head comprising:
a base provided with a concave pressurizing chamber for holding ink and
a piezoelectric element which
has a plate-shaped piezoelectric body and a pair of electrodes arranged so as to sandwich the piezoelectric body in a thickness direction and is superimposed on and fastened to the base in the thickness direction so as to close the pressurizing chamber, wherein the base has a higher thermal expansion coefficient than the piezoelectric element, and the piezoelectric body has a tetragonal principal crystal phase, in which the degree of orientation of the c-axis toward one side in the thickness direction in the region sandwiched by the pair of electrodes is 44% or more and 56% or less in terms of the Lotgering factor, and in which the residual stress in the surface direction is 0 MPa or more and 35 MPa or less in the direction of compression.

5. A method for producing a piezoelectric actuator comprising:

a step of preparing a piezoelectric element which has a plate-shaped piezoelectric body and a pair of electrodes arranged so as to sandwich the piezoelectric body in a thickness direction, a step of preparing a base having a higher thermal expansion coefficient than the piezoelectric element, a step of superimposing the piezoelectric element and the base on each other in the thickness direction and fastening them by an adhesive, and a step of, after the step of fastening, cooling the piezoelectric element and the base down to a temperature lower than ordinary temperature.

6. The method for producing a piezoelectric actuator as set forth in claim 5, wherein, in the step of fastening, the adhesive for bonding the piezoelectric element and the base is made to cure at ordinary temperature.

7. The method for producing a piezoelectric actuator as set forth in claim 6, wherein, in the step of cooling, the piezoelectric element and the base are cooled down to −40° C. or less.

8. A method for producing a piezoelectric actuator as set forth in claim 5, wherein a temperature difference between the step of fastening and the step of cooling is 65° C. or more.

* * * * *